United States Patent
Matsuoka et al.

(10) Patent No.: US 10,131,135 B2
(45) Date of Patent: Nov. 20, 2018

(54) IMPRINT APPARATUS AND IMPRINT METHOD

(71) Applicant: TOSHIBA MEMORY CORPORATION, Tokyo (JP)

(72) Inventors: Yasuo Matsuoka, Kanagawa (JP); Hiroshi Nomura, Kanagawa (JP); Masahito Hiroshima, Tokyo (JP)

(73) Assignee: Toshiba Memory Corporation, Tokyo (JP)

( * ) Notice: Subject to any disclaimer, the term of this patent is extended or adjusted under 35 U.S.C. 154(b) by 103 days.

(21) Appl. No.: 15/059,625

(22) Filed: Mar. 3, 2016

(65) Prior Publication Data

US 2017/0021607 A1 Jan. 26, 2017

(30) Foreign Application Priority Data

Jul. 24, 2015 (JP) .................. 2015-147153

(51) Int. Cl.
*B41F 1/26* (2006.01)
*B41F 1/18* (2006.01)

(52) U.S. Cl.
CPC . *B41F 1/26* (2013.01); *B41F 1/18* (2013.01)

(58) Field of Classification Search
None
See application file for complete search history.

(56) References Cited

U.S. PATENT DOCUMENTS

| 2007/0141191 A1* | 6/2007 | Kruijt-Stegeman | ......................... B29C 59/022 425/174.4 |
| 2012/0196389 A1* | 8/2012 | Matsuoka | ............... H01L 22/12 438/17 |
| 2014/0208850 A1* | 7/2014 | Kim | ......................... G01N 29/14 73/587 |
| 2015/0190961 A1 | 7/2015 | Nakagawa et al. | |

FOREIGN PATENT DOCUMENTS

| JP | 62-132282 | 6/1987 |
| JP | 2000-121615 | 4/2000 |
| JP | 2003-308670 A | 10/2003 |
| JP | 2011-007750 | 1/2011 |
| JP | 2012-235044 | 11/2012 |
| JP | 2015-130448 A | 7/2015 |

* cited by examiner

*Primary Examiner* — Joshua D Zimmerman
(74) *Attorney, Agent, or Firm* — Finnegan, Henderson, Farabow, Garrett & Dunner, L.L.P.

(57) ABSTRACT

An imprint apparatus according to one embodiment includes a contact processing unit and a defect determination unit. The contact processing unit brings a template pattern formed on a front surface of a template into contact with resist placed on a substrate. The defect determination unit determines a defect in an imprint process, on the basis of force which is generated from at least one of the template, the resist, and the substrate, during the imprint process.

6 Claims, 12 Drawing Sheets

IMPRINT APPARATUS AND IMPRINT METHOD

CROSS-REFERENCE TO RELATED APPLICATIONS

This application is based upon and claims the benefit of priority from Japanese Patent Application No. 2015-147153, filed on Jul. 24, 2015; the entire contents of which are incorporated herein by reference.

FIELD

Embodiments described herein relate generally to an imprint apparatus and an imprint method.

BACKGROUND

There is a process using an imprint method as one of the processes of manufacturing a semiconductor device. In the imprint method, a template of an original plate is pressed against resist on a substrate to transfer a template pattern to the resist.

However, in the imprint method, in some cases, for example, when the template is pressed against the resist or when the template is separated from the resist, the damage of the template or a common defect between shots occurs unexpectedly.

DETAILED DESCRIPTION

According to one embodiment, an imprint apparatus is provided. The imprint apparatus includes a contact processing unit and a defect determination unit. The contact processing unit brings a template pattern formed on a front surface of a template into contact with resist placed on a substrate. The defect determination unit determines a defect in an imprint process, on the basis of force which is generated from at least one of the template, the resist, and the substrate, during the imprint process.

Hereinafter, an imprint apparatus and an imprint method according to embodiments of the invention will be described in detail with reference to the accompanying drawings. The invention is not limited by these embodiments.

First Embodiment

Figure 1:
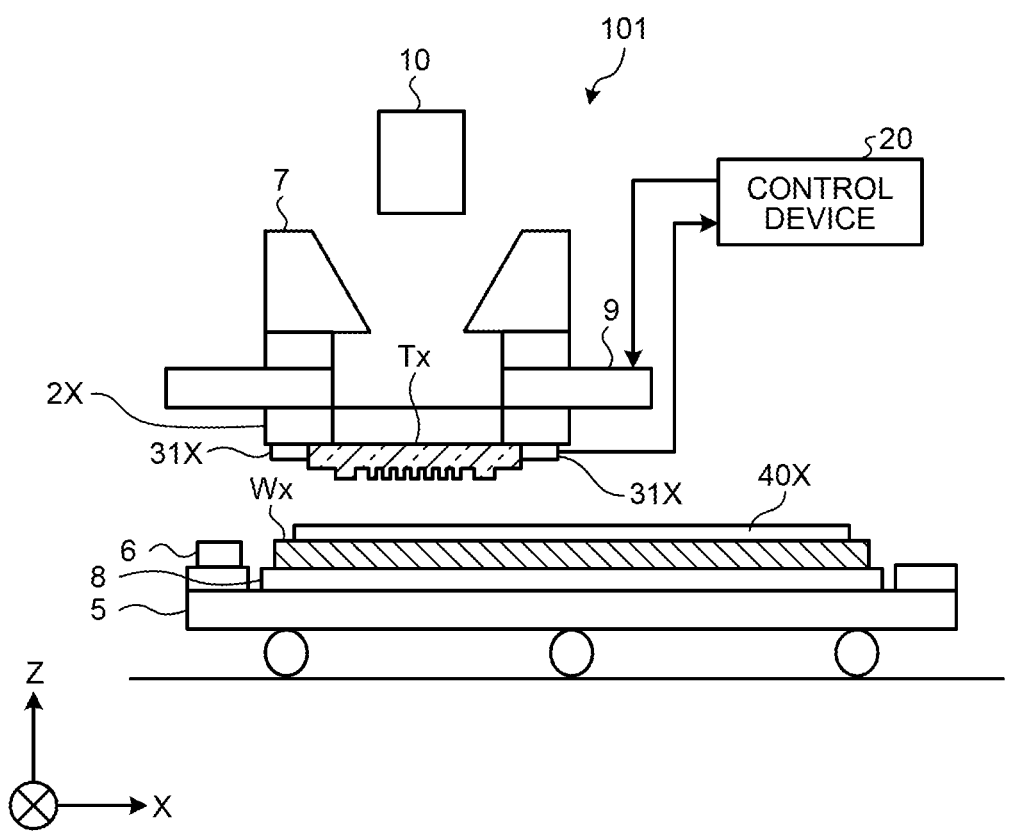
FIG. 1 is a diagram illustrating the structure of an imprint apparatus according to a first embodiment.

FIG. 1 is a diagram illustrating the structure of an imprint apparatus according to a first embodiment. FIG. 1 illustrates the structure of an imprint apparatus 101 as viewed from the Y-axis direction. In this embodiment, a plane on which a wafer Wx is placed is an X-Y plane and the upper surface of the wafer Wx is perpendicular to the Z-axis.

The imprint apparatus 101 is an apparatus that performs an imprint process such as an optical nanoimprint process. The imprint apparatus 101 transfers a template pattern of a template Tx, which is a mold substrate, to a substrate (semiconductor substrate) to which a pattern will be transferred, such as a wafer Wx. The template is a template of the original plate having a main surface which is formed using a rectangular plate member and the template pattern is an uneven pattern such as a circuit pattern.

The imprint apparatus 101 forms a resist pattern on the entire surface of the wafer Wx using a step-and-repeat method. The imprint apparatus 101 detects a defect (for example, a pattern defect) which occurs during the imprint process in real time.

In the imprint apparatus 101 according to this embodiment, an AE sensor 50X, which will be described below, is provided on, for example, a side surface of the template Tx. The AE sensor 50X detects an AE signal during the imprint process and detects, for example, the contact between the template Tx and a foreign material and the damage of the template Tx.

The imprint apparatus 101 includes an original plate stage 2X, a sample stage 5, a reference mark 6, an alignment sensor 7, a substrate chuck 8, a stage base 9, a UV light source 10, and an actuator 31X. In addition, the imprint apparatus 101 according to this embodiment includes a control device 20.

The sample stage 5 is mounted with the wafer Wx and is moved in a plane (a horizontal plane) parallel to the wafer Wx mounted thereon. The sample stage 5 loads the wafer Wx having resist 40X as a transfer material which is applied on the entire surface or substantially the entire surface thereof (the entire surface except for the edge) and moves the wafer Wx below the template Tx. When the imprint process is performed for the wafer Wx, the sample stage 5 sequentially moves shot positions on the wafer Wx below the template Tx.

The substrate chuck 8 is provided on the sample stage 5. The substrate chuck 8 fixes the wafer Wx at a certain position on the sample stage 5. The reference mark 6 is provided on the sample stage 5. The reference mark 6 is a mark which is used to detect the position of the sample stage 5 and is used for alignment when the wafer Wx is loaded onto the sample stage 5.

The original plate stage 2X is provided on the bottom side (on the side of the wafer Wx) of the stage base 9. The original plate stage 2X fixes the template Tx at a certain position from the rear surface (a surface on which the template pattern is not formed) of the template Tx using, for example, vacuum suction.

The actuator 31X is provided on the bottom side of the original plate stage 2X. The actuator 31X is a piezoelectric actuator. The actuator 31X has the function of a manipulator. The actuator 31X presses the template Tx from all side surfaces of the template Tx to adjust the template Tx to a certain size.

The stage base 9 supports the template Tx with the original plate stage 2X and presses the template pattern of the template Tx against the resist 40X on the wafer Wx. The stage base 9 is moved in the up-down direction (vertical direction) to press the template Tx against the resist 40X and to separate (release) the template Tx from the resist 40X.

The resist 40X to be used for imprinting is a resin (a photo-curing agent) having, for example, a photo-curable characteristic. The alignment sensor 7 is provided on the stage base 9. The alignment sensor 7 detects the position of the wafer Wx and the position of the template Tx.

The UV light source 10 is a light source that radiates light, such as UV light, and is provided above the stage base 9. The UV light source 10 radiates UV light to the transparent template Tx, with the template Tx pressed against the resist 40X.

The control device 20 is connected to each component of the imprint apparatus 101 and controls each element. In FIG. 1, the connection of the control device 20 to the stage base 9 and the actuator 31X is illustrated and the connection of the control device 20 to the other components is not illustrated.

The control device 20 according to this embodiment determines whether a defect has occurred during the imprint process on the basis of sensor information, which will be described below, and force (for example, an AE wave) generated during the imprint process. When it is determined that a defect has occurred during the imprint process, the control device 20 performs a control process of stopping the imprint process or a process of outputting information (determination information) related to the defect. In addition, the control device 20 generates information (sensor information) for correcting a defect occurrence position during the imprint process, using a correction template Tp which will be described below.

When the imprint process is performed for the wafer Wx, the wafer Wx having the resist 40X applied or dropped thereon is moved immediately below the template Tx. Then, the template Tx is pressed against the resist 40X on the wafer Wx.

The imprint apparatus 101 may have a structure in which the resist 40X is pressed against the template Tx, instead of the structure in which the template Tx is pressed against the resist 40X. In this case, the sample stage 5 presses the resist 40X on the wafer Wx against the template Tx. As such, in the imprint apparatus 101, when the template Tx (template pattern) is pressed against the resist 40X, the distance between the template Tx and the wafer Wx having the resist 40X arranged thereon becomes close to a certain distance. Then, the template pattern comes into contact with the resist 40X. In FIG. 1 and the following FIGS. 2A to 2D, a counter bore of the template Tx is not illustrated.

Next, the procedure of the imprint process will be described. FIGS. 2A to 2D are diagrams illustrating the procedure of the imprint process. FIGS. 2A to 2D are cross-sectional views illustrating, for example, the wafer Wx and the template Tx during the imprint process.

Figure 2A:
FIGS. 2A to 2D are diagrams illustrating the procedure of an imprint process.

As illustrated in FIG. 2A, the resist 40X is dropped to the upper surface of the wafer Wx by an ink-jet method. The resist 40X is an imprint material such as a photo-curable resin material. For example, a low-k (low-permittivity) film or organic material is used as the resist 40X.

Figure 2B:
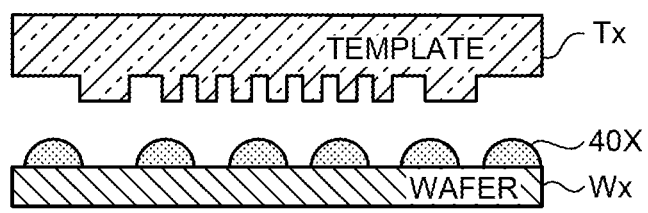
Figure 2C:
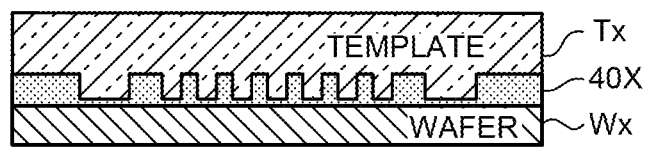

After the resist 40X is dropped, the template Tx is moved to the resist 40X as illustrated in of FIG. 2B and the template Tx is pressed against the resist 40X as illustrated in FIG. 2C. When the template Tx obtained by engraving a pattern on, for example, a quartz substrate comes into contact with the resist 40X, the resist 40X flows into the template pattern of the template Tx by a capillary phenomenon. The template pattern is an uneven pattern formed by, for example, plasma etching.

The template Tx comes into contact with the resist 40X only for a certain period of time. Then, the template pattern is filled with the resist 40X. In this state, when the UV light source 10 radiates UV light to the resist 40X through the template Tx, the resist 40X is hardened.

Figure 2D:

Then, as illustrated in FIG. 2D, the template Tx is separated from a hardened resist (resist pattern) 40Y and the resist 40Y to which the template pattern has been transferred is formed on the wafer Wx. The resist 40Y has a thin residual layer between the wafer Wx, which is an adhesive layer, and the bottom of a concave portion in the uneven pattern. The residual layer has a thickness of, for example, 10 nm to a few tens of nanometers. The imprint apparatus 101 performs a first shot of the imprint process on the wafer Wx and then performs a second shot of the imprint process on the wafer Wx.

Figure 3:
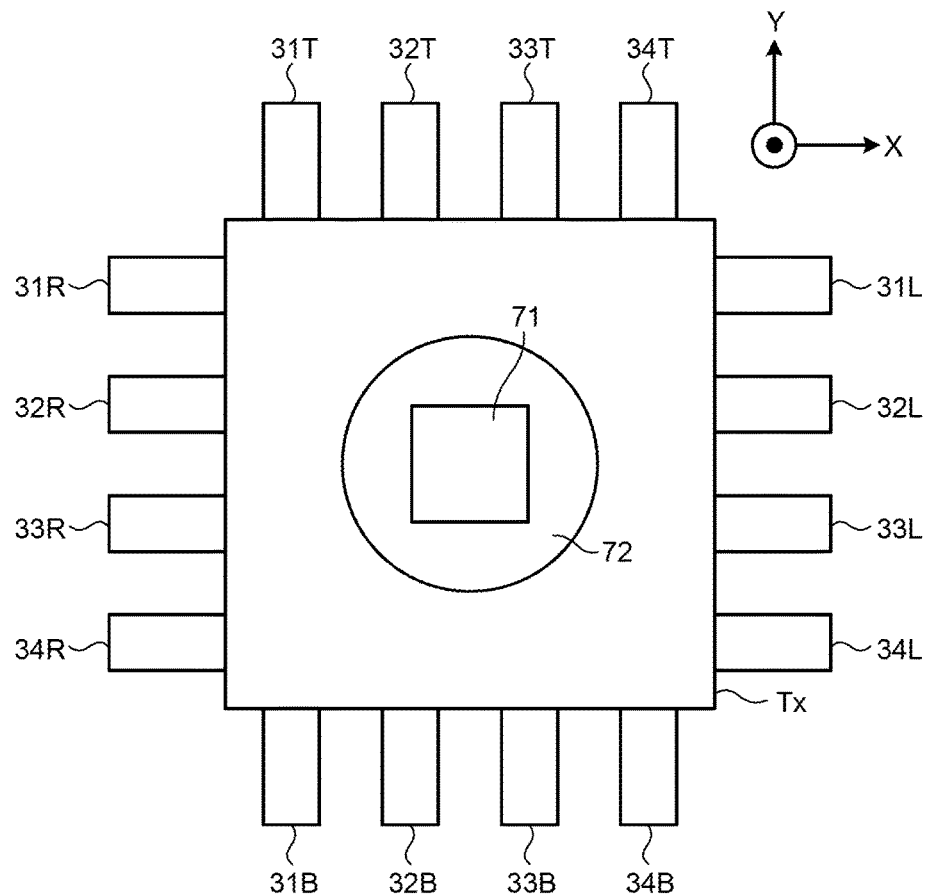
FIG. 3 is a top view illustrating the structure of an actuator according to the first embodiment.

Then, the structure of the actuator 31X according to the first embodiment will be described. FIG. 3 is a top view illustrating the structure of the actuator according to the first embodiment. FIG. 3 is a top view illustrating the actuator 31X and the template Tx as viewed from the Z-axis direction.

FIG. 3 illustrates a case in which the actuator 31X that supports the template Tx from the side surface includes actuators 31R to 34R, actuators 31L to 34L, actuators 31T to 34T, and actuators 31B to 34B.

The template Tx has a pattern region 71, in which the template pattern is formed, at the center thereof. The pattern region 71 is, for example, a rectangular region. The pattern region 71 is formed on the front surface of the template Tx. The rear surface of the template Tx is fixed to the original plate stage 2X.

A counter bore 72 is provided in the pattern region 71 and a region which is arranged outside the pattern region 71. The counter bore 72 is formed by boring a hole in the template Tx to a certain depth from the rear surface of the template Tx. The counter bore 72 has, for example, a cylindrical hole shape. Therefore, the pattern region 71 and the periphery thereof are thinner than the other regions of the template Tx.

The actuator 31X is arranged on the side of the template Tx such that it can press the side surface of the template Tx. The actuators 31R to 34R press a side surface which faces the −X direction among the size surfaces of the template Tx. The actuators 31L to 34L press a side surface which faces the +X direction among the size surfaces of the template Tx. The actuators 31T to 34T press a side surface which faces the +Y direction among the size surfaces of the template Tx. The actuators 31B to 34B press a side surface which faces the -Y direction among the size surfaces of the template Tx.

Figure 4:
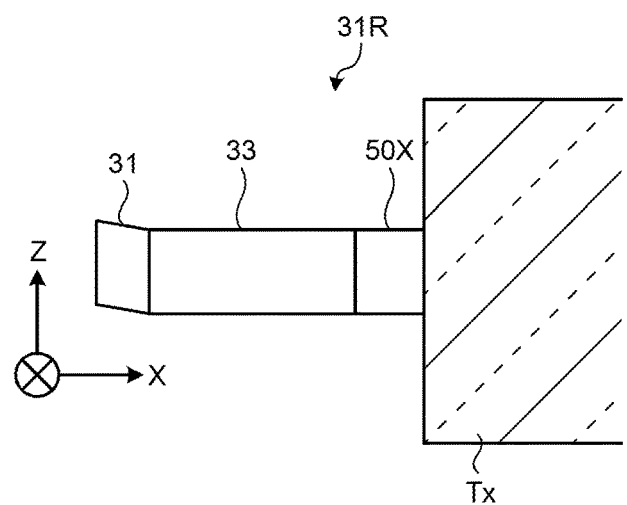
FIG. 4 is a cross-sectional view illustrating the structure of the actuator according to the first embodiment.

FIG. 4 is a cross-sectional view illustrating the structure of the actuator according to the first embodiment. FIG. 4 is a cross-sectional view illustrating the actuator 31X as viewed from the Y-axis direction. Since the actuators 31R to 34R, the actuators 31L to 34L, the actuators 31T to 34T, and the actuators 31B to 34B have the same structure, only the structure of the actuator 31R will be described in this embodiment.

The actuator 31R which is an example of the actuator 31X includes piezoelectric elements 31 and 33 and an acoustic emission (AE) sensor 50X. In the actuator 31R, the piezoelectric element 31, the piezoelectric element 33, and the AE sensor 50X are connected in series to each other to form a rod shape.

The AE sensor 50X is provided at one end of the actuator 31R in the longitudinal direction and the piezoelectric element 31 is provided at the other end of the actuator 31R. The piezoelectric element 33 is provided between the AE sensor 50X and the piezoelectric element 31.

For example, the actuator 31R is provided at a position where the AE sensor 50X provided at the one end of the actuator 31R can press the side surface of the template Tx. The piezoelectric elements 31 and 33 and the AE sensor 50X may be provided at any position in the actuator 31X.

The piezoelectric element 31 is a d31-mode piezoelectric element and the piezoelectric element 33 is a d33-mode piezoelectric element. The piezoelectric element 31 is provided in the actuator 31X so as to be expanded and contracted in the X direction. The piezoelectric element 33 is provided in the actuator 31X so as to be expanded and contracted in the Z direction.

The AE sensor 50X is formed using, for example, a piezoelectric element. The AE sensor 50X detects a defect in the imprint process. Specifically, the AE sensor 50X detects an AE wave which is generated due to, for example, the contact between the template Tx and a foreign material and the damage of the template Tx.

When the actuator 31X presses the side surface of the template Tx, the distortion of the template Tx in the X direction and the Y direction is adjusted by the piezoelectric element 33. Specifically, the distortion of the template Tx in the X direction is adjusted by the actuators 31R to 34R and the actuators 31L to 34L and the distortion of the template Tx in the Y direction is adjusted by the actuators 31T to 34T and the actuators 31B to 34B.

The piezoelectric element 31 is expanded and contracted in the Z direction to vibrate the template Tx in the Z direction. When the template pattern is filled with the resist 40X, the template Tx is vibrated in the Z direction by the piezoelectric element 31. Therefore, it is easy to separate the template Tx from the resist 40Y.

The number of actuators 31X including the AE sensors 50X is not limited to 16 and any number of actuators 31X may be provided. For example, at least three actuators 31X including the AE sensors 50X may be provided. In this case, it is possible to accurately detect the position where a defect occurs.

For example, one set of four actuators 31X are provided. In this case, one actuator 31X is provided for each of the four sides of the template Tx. Two actuators 31X are provided at positions which are opposite to each other in the X direction and two actuators 31X are provided at positions which are opposite to each other in the Y direction, as viewed from the template Tx.

In this embodiment, the actuators 31R to 34R are provided at positions which are opposite to the actuators 31L to 34L in the X direction, respectively. The actuators 31T to 34T are provided at positions which are opposite to the actuators 31B to 34B in the Y direction, respectively. One set of two actuators 31X may be provided.

As the area of a surface (frequency detection surface) of the AE sensor 50X which comes into contact with the side surface of the template Tx is reduced, a measurement error caused by the contact area is reduced. Therefore, it is preferable that the area of a surface (AE wave detection surface) of the AE sensor 50X which comes into contact the side surface of the template Tx be reduced.

The AE sensors 50X may have different measurement target ranges (AE wave detection frequencies). For example, the AE sensors 50X of the actuators 31R, 31L, 31T, and 31B may detect a first frequency band and the AE sensors 50X of the actuators 32R, 32L, 32T, and 32B may defect a second frequency band. In addition, the AE sensors 50X of the actuators 33R, 33L, 33T, and 33B may detect a third frequency band and the AE sensors 50X of the actuators 34R, 34L, 34T, and 34B may detect a fourth frequency band.

The position where the AE sensor 50X is provided is not limited to the bottom of the template Tx (the inside of the actuator 31X) and the AE sensor 50X may be provided at any position. For example, the AE sensor 50X may be provided on the upper surface or side surface of the original plate stage 2X or in the original plate stage 2X. In addition, the AE sensor 50X may be provided on, for example, the upper surface or side surface of the template Tx. For example, the AE sensor 50X may be provided on the side surface or bottom of the substrate chuck 8 or in the substrate chuck 8. Furthermore, the AE sensor 50X may be provided on, for example, the upper surface or side surface of the wafer Wx.

The AE sensors 50X may measure different detection frequencies at different positions. For example, the AE sensor 50X which is provided in the vicinity of the original plate stage 2X measures a detection frequency corresponding to the members or shapes of the template Tx and the original plate stage 2X. The AE sensor 50X which is provided in the vicinity of the substrate chuck 8 measures a detection frequency corresponding to the members or shapes of the template Tx and the substrate chuck 8.

Figure 5:
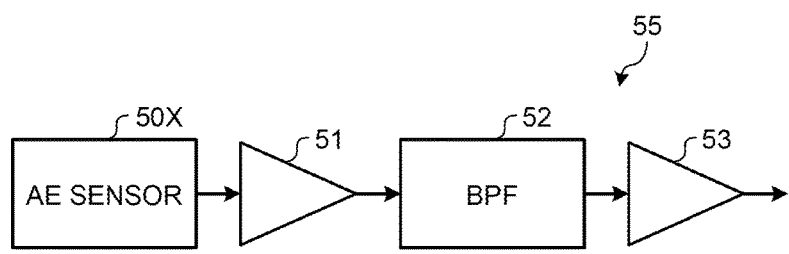
FIG. 5 is a diagram illustrating the structure of an AE measurement system.

FIG. 5 is a diagram illustrating the structure of an AE measurement system. An AE measurement system 55 includes the AE sensor 50X, a pre-amplifier 51, a band pass filter (BPF) 52, and a main amplifier 53 which are connected in series to each other.

The AE sensor 50X transmits the detected AE wave as the AE signal to the pre-amplifier 51. The pre-amplifier 51 amplifies the AE signal and transmits the amplified AE signal to the BPF 52. The BPF 52 is a filter circuit, transmits only frequencies in a certain range in the AE signal, and transmits the AE signal to the main amplifier 53. The main amplifier 53 amplifies the AE signal transmitted from the BPF 52 and transmits the amplified AE signal to an AD converter (not illustrated). The AE signal is converted into a digital signal by the AD converter and is then input to the control device 20.

Figure 6:
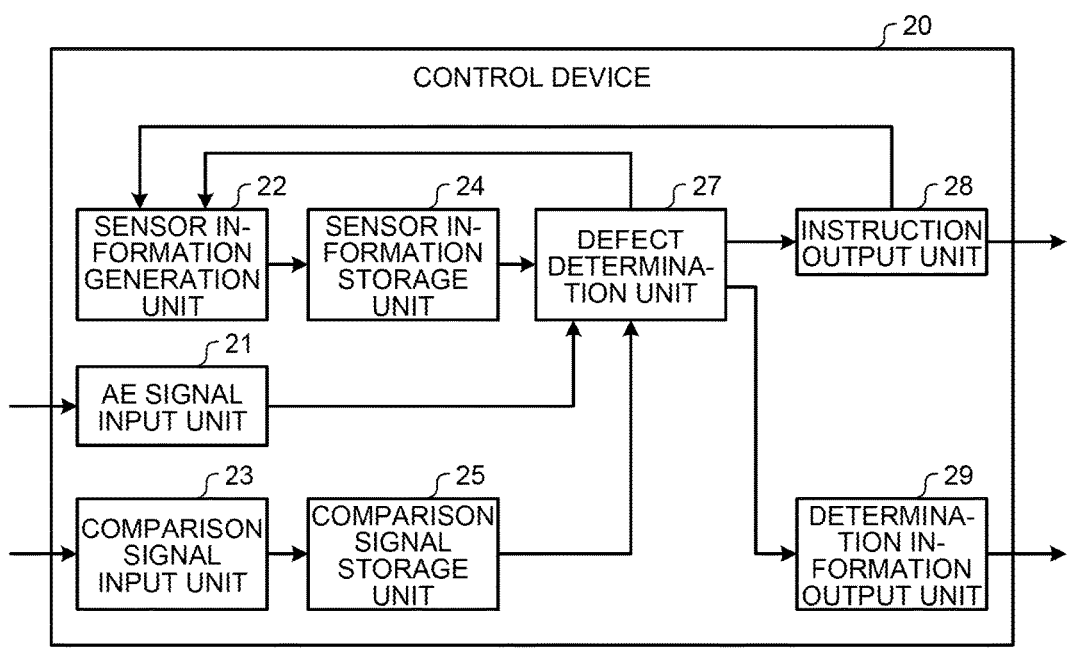
FIG. 6 is a diagram illustrating the structure of a control device according to the first embodiment.

FIG. 6 is a diagram illustrating the structure of the control device according to the first embodiment. The control device 20 includes an AE signal input unit 21, a sensor information generation unit 22, a comparison signal input unit 23, a sensor information storage unit 24, and a comparison signal storage unit 25. In addition, the control device 20 includes a defect determination unit 27, an instruction output unit 28, and a determination information output unit 29.

An AE signal (waveform) transmitted from an external device is input to the AE signal input unit 21. The AE signal input unit 21 transmits the AE signal to the defect determination unit 27. An AE signal which is predicted to be generated when a defect occurs in the template Tx is input to the comparison signal input unit 23. The AE signal input to the comparison signal input unit 23 is an AE signal for comparison which is used as a comparison target when the occurrence of a defect or the type of defect is determined. Examples of the AE signal for comparison include an AE signal which is generated when a foreign material comes into contact with the template Tx and an AE signal which is generated when the template Tx is damaged. Instead of the AE signal for comparison, for example, a reference value for comparison may be input to the comparison signal input unit 23.

The AE signal for comparison is input to the comparison signal input unit 23 from the outside. The comparison signal input unit 23 stores the AE signal for comparison in the comparison signal storage unit 25. The comparison signal storage unit 25 is, for example, a memory that stores the AE signal for comparison.

First positional information which is transmitted from the instruction output unit 28 is input to the sensor information generation unit 22. The first positional information is information (coordinates) about the position where an intentional defect occurs in the correction template Tp. In addition, second positional information which is transmitted from the defect determination unit 27 is input to the sensor information generation unit 22. The second positional information is information indicating the actual defect occurrence position analyzed by the defect determination unit 27.

The sensor information generation unit 22 generates sensor information on the basis of the first positional information and the second positional information. The sensor information is used to correct the defect occurrence position. The sensor information is information indicating the difference between the defect occurrence position detected by the AE sensor 50X and the actual defect occurrence position.

The first positional information indicates the defect occurrence position where an intentional defect occurs in the correction template Tp. In other words, the first positional information indicates the actual defect occurrence position. The second positional information indicates the defect occurrence position specified by the AE sensor 50X. Therefore, the difference between the first positional information and the second positional information is a detected position error caused by, for example, the arrangement area of the AE sensor 50X. The sensor information generation unit 22 stores the sensor information in the sensor information storage unit 24. The sensor information storage unit 24 is, for example, a memory which stores the sensor information.

The defect determination unit 27 analyzes the AE signal transmitted from the AE signal input unit 21. When the sensor information is generated, the defect determination unit 27 analyzes the AE signal generated in the correction template Tp and specifies the defect occurrence position. The defect determination unit 27 transmits the defect occurrence position of the correction template Tp as the second positional information to the sensor information generation unit 22.

During the imprint process, the defect determination unit 27 analyzes the AE signal generated during the imprint process and specifies the defect occurrence position. Then, the defect determination unit 27 corrects the specified defect occurrence position on the basis of the sensor information. In addition, the defect determination unit 27 compares the AE signal after correction with the AE signal for comparison to determine whether a defect has occurred in the template Tx.

The defect determination unit 27 determines that a defect has occurred when the similarity of the AE signal after correction to the AE signal for comparison is within a certain range. In addition, the defect determination unit 27 determines that a defect has occurred when a waveform element (for example, the amplitude) of the AE signal after correction is greater than the reference value for comparison.

In this embodiment, the defect determination unit 27 determines a defect during the imprint process, on the basis of the AE wave which is generated from at least one of the template Tx, the resists 40X and 40Y, and the wafer Wx. In addition, for example, the defect determination unit 27 may detect a defect in any of a process of imprinting the template Tx on the resist 40X, a process of irradiating the resist 40X with UV light to harden the resist 40X, and a separation process during the imprint process. In this case, it is possible to determine, for example, the degree of damage of the template Tx, the degree of damage of the resists 40X and 40Y, and the degree of damage of the wafer Wx.

When it is determined that a defect has occurred, the defect determination unit 27 transmits a control instruction corresponding to the defect which has occurred to, for example, the stage base 9. For example, when it is determined that the defect is close to a defect which makes it difficult to restore the template Tx, the defect determination unit 27 transmits an instruction to stop the imprint process to the instruction output unit 28.

The defect determination unit 27 transmits the determination result to the determination information output unit 29. The determination information output unit 29 transmits the determination result to an external device such as a display device (not illustrated). Then, the determination result is displayed on, for example, the display device. Here, the determination result is, for example, the defect occurrence position of the template Tx and the type of defect.

The instruction output unit 28 transmits various kinds of instruction information to each component of the imprint apparatus 101. When the template Tx is loaded, the instruction output unit 28 transmits instruction information related to the loading or fixing of the template Tx to, for example, the original plate stage 2X, the sample stage 5, the alignment sensor 7, the substrate chuck 8, the stage base 9, and the actuator 31X.

During the imprint process, the instruction output unit 28 transmits, for example, an instruction related to an imprint position or an instruction related to the correction of the position of the template Tx to the original plate stage 2X, the sample stage 5, the alignment sensor 7, the stage base 9, the UV light source 10, and the actuator 31X.

When the sensor information is generated, the instruction output unit 28 transmits an instruction to make a current flow to the correction template Tp to a terminal, which will be described below, and transmits information about the position where a current flows as the first positional information to the sensor information generation unit 22.

For example, when an imprint process stop instruction is transmitted from the defect determination unit 27, the instruction output unit 28 transmits the imprint process stop instruction to each component of the imprint apparatus 101.

Figure 7:
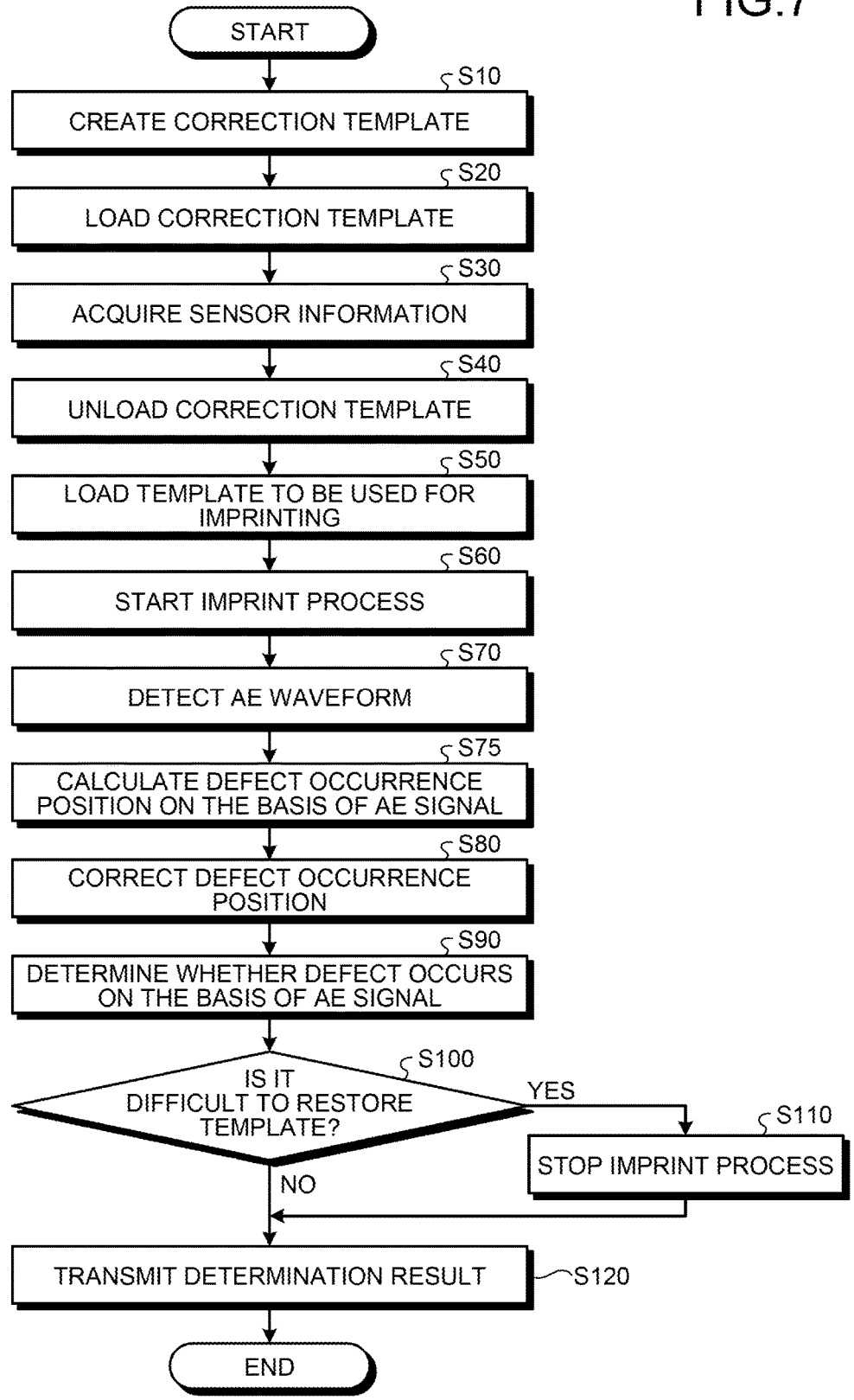
FIG. 7 is a flowchart illustrating the procedure of an inspection process in an imprint process.

FIG. 7 is a flowchart illustrating the procedure of an inspection process in the imprint process. The AE signal for comparison or the reference value for comparison is input to the control device 20 of the imprint apparatus 101 in advance. Before the imprint process starts, the correction template Tp is manufactured (Step S10). The correction template Tp is used to acquire the sensor information.

Figure 8:
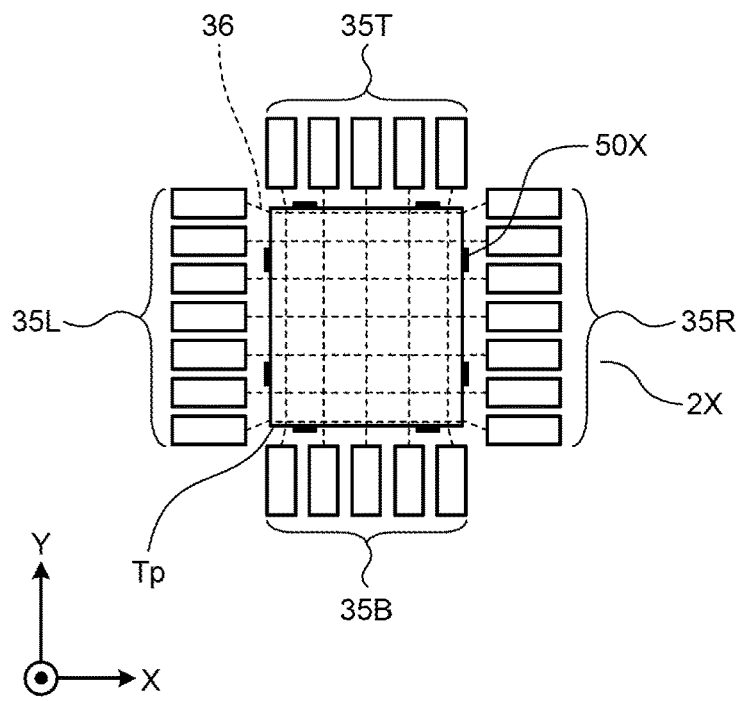
FIG. 8 is a diagram illustrating an example of the structure of a correction template.

FIG. 8 is a diagram illustrating an example of the structure of the correction template. FIG. 8 is a cross-sectional view illustrating the correction template Tp taken along the X-Y plane. In FIG. 8, the actuator 31X is not illustrated. In addition, FIG. 8 illustrates a case in which eight AE sensors 50X are provided on the side surfaces of the correction template Tp.

The correction template Tp is formed of the same member as the template Tx and has the same shape as the template Tx. Conductive wires 36 are formed on the rear surface of the correction template Tp. The wires 36 are arranged at certain intervals in the X direction and the Y direction. In other words, the wires 36 are line patterns and are arranged in a mesh shape in the X direction and the Y direction. The wires 36 arranged in the X direction and the wires 36 arranged in the Y direction intersect each other on the rear surface of the correction template Tp. The wires 36 are arranged such that the intersections (intersection points) are arranged at certain cycles in the X direction and the Y direction.

Each wire 36 is connected to the terminals in a region arranged outside the correction template Tp. The terminal is a terminal for connection to the outside. The wire 36 arranged in the X direction is connected to a terminal 35R arranged in the +X direction and a terminal 35L arranged in the −X direction. For example, when N (N is a natural number) wires 36 are arranged in the X direction, N terminals 35R and N terminals 35L are provided. One terminal 35R and one terminal 35L are connected to one wire 36.

Similarly, the wire 36 arranged in the Y direction is connected to a terminal 35T arranged in the +Y direction and a terminal 35B arranged in the −Y direction. For example, when M (M is a natural number) wires 36 are arranged in the Y direction, M terminals 35T and M terminals 35B are provided. One terminal 35T and one terminal 35B are connected to one wire 36.

The terminals 35R, 35L, 35T, and 35B are provided on the bottom of the original plate stage 2X. In the following description, in some cases, the terminals 35R, 35L, 35T, and 35B are referred to as terminals 35X.

When the sensor information is acquired, a current selectively flows to any one of the terminals 35X. For example, one terminal 35R among the terminals 35R and a terminal 35L which is connected to the terminal 35R through the wire 36 are selected as the terminals in the X direction. In addition, one terminal 35T among the terminals 35T and a terminal 35B which is connected to the terminal 35T through the wire 36 are selected as the terminals in the Y direction.

Then, a current flows between the selected terminals in the X direction and between the selected terminals in the Y direction. Then, the wire 36 between the selected terminals in the X direction and the wire 36 between the selected terminals in the Y direction are short-circuited at the intersection point therebetween. As a result, an AE wave is generated from the template Tx at the position of the intersection point where the short circuit occurs. The AE wave is detected by the AE sensor 50X.

The correction template Tp is not limited to the structure illustrated in FIG. 8 and may have other structures. For example, a template having, for example, a pseudo defect may be used as the correction template Tp. In this case, a foreign material may be formed on the correction template Tp by, for example, a focused ion beam (FIB).

The manufactured correction template Tp is loaded to the imprint apparatus 101 (Step S20). The original plate stage 2X fixes the loaded correction template Tp from the rear surface, using vacuum suction. The actuator 31X presses the side surface of the correction template Tp. Then, the bottom and side surface of the correction template Tp is fixed.

Then, the control device 20 sequentially supplies a current to the terminals 35X of the correction template Tp. When L intersection points are formed by the wires 36, the instruction output unit 28 makes a current flow such that the wires are sequentially short-circuited at the L intersection points. When the short circuit occurs at the intersection point, the AE sensor 50X detects an AE wave generated by the short circuit. An AE signal corresponding to the AE wave is transmitted to the defect determination unit 27.

Then, the defect determination unit 27 specifies a defect occurrence position on the basis of the AE signal. The defect determination unit 27 transmits the specified defect occurrence position as the second positional information to the sensor information generation unit 22. In addition, information indicating the position of the intersection point where the short circuit has occurred is transmitted as the first positional information from the instruction output unit 28 to the sensor information generation unit 22.

The sensor information generation unit 22 generates sensor information on the basis of the first positional information and the second positional information. Then, the sensor information generation unit 22 transmits the generated sensor information to the sensor information storage unit 24. In this way, the control device 20 acquires the sensor information (Step S30).

Figure 9:
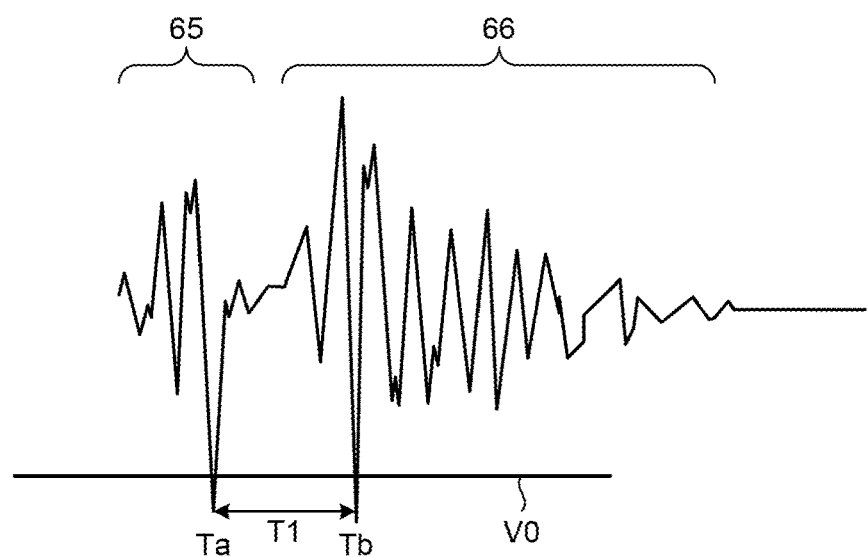
FIG. 9 is a diagram illustrating a method for specifying a defect occurrence position using a longitudinal wave and a lateral wave of an AE signal.

It is understood that an AE signal is generated when a physical destruction phenomenon occurs due to abnormality such as a defect. Here, a method of specifying the defect occurrence position using the AE sensor 50X will be described. FIG. 9 is a diagram illustrating a method of specifying the defect occurrence position using a longitudinal wave and a lateral wave of the AE signal.

When a defect, such as a crack, occurs in the template Tx, a longitudinal wave (P-wave) 65 and a lateral wave (S-wave) 66 are included in the AE signal. The longitudinal wave 65 is propagated at a speed of, for example, 5770 m/sec in the template Tx or the correction template Tp. The lateral wave 66 is propagated at a speed of, for example, 3462 m/sec in the template Tx or the correction template Tp.

A threshold value (reference value) V0 for a signal waveform is set as an example of the AE signal for comparison to the defect determination unit 27. The threshold value V0 indicates a certain amplitude. The defect determination unit 27 determines a time Ta when the signal waveform of the longitudinal wave 65 reaches the threshold value V0 to be the arrival time of the longitudinal wave 65. In addition, the defect determination unit 27 determines a time Tb when the signal waveform of the lateral wave 66 reaches the threshold value V0 to be the arrival time of the lateral wave 66.

The defect determination unit 27 calculates an elapsed time T1 (T1=Tb−Ta) from the time Ta to the time Tb. The elapsed time T1 is the time from the arrival of the longitudinal wave 65 to the arrival of the lateral wave 66 (the difference between the arrival time of the P-wave and the arrival time of the S-wave). The defect determination unit 27 calculates the distance from the AE sensor 50X to the defect occurrence position, using the elapsed time T1, the propagation speed of the longitudinal wave 65, and the propagation speed of the lateral wave 66.

The defect determination unit 27 may calculate the distance from the AE sensor 50X to the defect occurrence position, using the arrival speed and propagation speed of a surface wave (R-wave), in addition to the longitudinal wave 65 and the lateral wave 66. In addition, the defect determination unit 27 may select at least two of the longitudinal wave 65, the lateral wave 66, and the surface wave and calculate the distance from the AE sensor 50X to the defect occurrence position, using the arrival speed and propagation speed of the two selected waves.

The threshold value for the signal waveform may be set to the frequency, amplitude, waveform shape, generation time, and generation interval of an elastic wave of the AE signal. In this case, the defect determination unit 27 compares at least one of the frequency, amplitude, waveform, generation time, and generation interval of the detected signal waveform with at least one predetermined threshold value to determine a defect. In addition, the threshold value for the signal waveform may be set to each type of defect or the degree of each defect.

The defect determination unit 27 calculates the distances from a plurality of AE sensors 50X to the defect occurrence position. Then, the defect determination unit 27 specifies a defect occurrence position on the basis of the plurality of calculated distances. In addition, the defect determination unit 27 may specify the defect occurrence position on the basis of the difference between the detection times of the AE signals detected by a plurality of AE sensors 50X.

The defect determination unit 27 transmits the specified defect occurrence position as the second positional information to the sensor information generation unit 22. The sensor information generation unit generates sensor information on the basis of the actual defect occurrence position (first positional information), which is the position of the intersection point, and the second positional information. The sensor information is stored in the sensor information storage unit 24.

After the second positional information is specified, the correction template Tp is unloaded from the imprint apparatus 101 (Step S40). Then, the template Tx used for imprinting is loaded to the imprint apparatus 101 (Step S50).

The original plate stage 2X fixes the loaded template Tx from the rear surface side, using vacuum suction. The actuator 31X presses the side surface of the template Tx. In this way, the bottom and side surface of the template Tx are fixed. Then, the imprint process starts (Step S60).

The imprint apparatus 101 presses the template Tx against the wafer Wx having the resist 40X arranged thereon. Then, the imprint apparatus 101 separates the template Tx from the hardened resist 40Y. In the imprint apparatus 101, during the imprint process, the AE sensor 50X detects the AE waveform.

When the AE sensor 50X detects the AE waveform (Step S70), an AE signal corresponding to the AE waveform is transmitted to the AE signal input unit 21 of the control device 20. The AE signal is transmitted to the defect determination unit 27. The defect determination unit 27 calculates the defect occurrence position on the basis of the AE signal (Step S75).

The defect determination unit 27 corrects the defect occurrence position on the basis of the sensor information (Step S80). The defect determination unit 27 compares the AE signal from the AE sensor 50X with the AE signal for comparison to determine whether a defect has occurred in, for example, the template Tx (Step S90). The defect determination unit 27 determines that a defect has occurred when the similarity of the AE signal from the AE sensor 50X to the AE signal for comparison is within a certain range.

When it is determined that a defect has occurred, the defect determination unit 27 determines whether the defect which has occurred is close to a state in which it is difficult to restore the template Tx (Step S100). When it is determined that the defect is close to the state in which it is difficult to restore the template Tx (Step S100, Yes), the defect determination unit 27 transmits, for example, an imprint process stop instruction (interrupt instruction) to the instruction output unit 28.

The instruction output unit 28 transmits the imprint process stop instruction to each component of the imprint apparatus 101. Then, the imprint process is stopped (Step S110). In addition, the defect determination unit 27 transmits the determination result to the determination information output unit 29.

When it is determined that the defect is not close to the state in which it is difficult to restore the template Tx (Step S100, No), the defect determination unit 27 transmits the determination result to the determination information output unit 29, without stopping the imprint process. The determination information output unit 29 transmits the determination result to, for example, a display device (Step S120).

The defect determination unit 27 may perform a process corresponding to the state of the defect. For example, the defect determination unit 27 may perform a first process when a certain element of the AE signal is greater than a first reference value and perform a P-th (P is a natural number) process when a certain element of the AE signal is greater than a P-th reference value. The first process is, for example, a process of transmitting a defect prediction report to the determination information output unit 29. The P-th process is, for example, a process of transmitting a notice of the reworking of the wafer Wx to the determination information output unit 29. In addition, the imprint apparatus 101 may learn, for example, the degree of defect using the imprint process and perform a process corresponding to the degree of defect.

As such, in this embodiment, a defect which occurs in the imprint process is detected during the imprint process (IN-SITU). Therefore, a defect is detected in real time. A sign of the defect is checked before the defect occurs and the occurrence of the defect is prevented. In some cases, during the imprint process, a defect occurs in the resist 40Y due to some factors. For example, the defect is caused by (1) the short shot of the resist 40X. The short shot of the resist is caused by, for example, dust or the peeling-off of the resist during the separation of the template.

The defect is caused by the following factors: (2) air bubbles, micro bubbles, and ink-jet bubbles; (3) the clogging of a concave portion of the template pattern by a foreign material; (4) a foreign material on the wafer Wx; and (5) a significant defect. In some cases, for example, a residual film of the resist 40Y is peeled off by these causes and the surface of the wafer Wx is exposed.

There is a defect (common defect) which occurs at the same position during each imprint shot. The defect causes, for example, the damage (cracking or breaking) of the template Tx, the deposition of dust on the resist 40X, the cracking of the resist 40X, and the breaking of the resist 40X.

In some cases, the deposition of dust with a very small size that does not cause a defect on the resist is the seeds of a defect. In this case, when an imprint shot is continuously repeated, the defect is grown to a defect size and a growth defect occurs. The defect determination unit 27 can perform a certain process for the AE signal to check the growth defect as a sign of a defect before the defect size reaches a certain value. In this case, the defect determination unit 27 determines a sign of the defect on the basis of a change in the AE signal at each shot. As such, the imprint apparatus 101 can discriminate the generation of an AE signal during a manufacturing process and operate as a predictive system that predicts an abnormal state different from a normal state.

An imprint area is different in a full-field imprint process which imprints the template pattern on the entire surface of the wafer Wx and an imprint process which imprints the template pattern on the periphery of the wafer Wx. Therefore, when the template Tx is separated, release force (frictional force) which is generated between the template Tx and the resist 40Y varies depending on the type of imprint process. The defect determination unit 27 may determine a change in the release force. In this case, the change in the release force can be fed back to imprint release force control.

In addition, the imprint apparatus 101 includes an ink-jet resist dropping device. The resist dropping device applies the resist 40X from scan nozzles (piezoelectric elements) which are arranged in a line corresponding to each shot. For this structure, the AE sensor 50X is provided in the vicinity of the scan nozzle, which makes it possible to directly monitor the flow rate and flow of the resist 40X.

In some cases, the stability of a resist material is managed or a flow test is performed for the resist 40X before the imprint apparatus 101 starts to be used. When the management or the test is performed, the AE sensor 50X may be used to check the flow state of the resist 40X.

In some cases, when the template is imprinted on the resist 40X, bubbles are generated in the resist 40X or the short shot of the resist 40X occurs. In this case, a large defect with an unspecified shape occurs. The AE sensor 50X may be used to detect this state.

When the viscosity of the resist 40X varies depending on a surrounding environment, in some cases, the resist 40X flows to an adjacent region along an uneven portion of the template pattern due to a capillary phenomenon and is then hardened by UV light. In this case, the AE sensor 50X may be used to specify, for example, an AE source at the defect occurrence position or a defect size. The above-mentioned defect determination process is an illustrative example and the defect determination process performed by the imprint apparatus 101 is not limited to the above-mentioned example.

Here, the AE wave will be described. Acoustic emission (AE) is an elastic wave phenomenon which occurs due to the minute breaking of a solid material or the same energy release process as that in the solid material. For example, the AE is a phenomenon in which, when a member, such as the template Tx or the wafer Wx, is deformed or when a crack occurs in the member, distortion energy stored in the member is emitted as an elastic wave.

In some cases, a foreign material gets between the template Tx and the resist 40Y, between the resist 40Y and the wafer Wx, and between the template Tx and the wafer Wx. In this case, a micro-crack occurs in a solid material due to, for example, the contact between the template Tx and the foreign material, the contact between the resist 40Y and the foreign material, and the contact between the wafer Wx and the foreign material. In this case, the AE wave is also generated.

In this embodiment, the AE wave is detected by a transducer, that is, the AE sensor 50X provided on the side surface of the template Tx and signal processing is performed to evaluate a fracture process. In general, the detected AE signal has a frequency band of a few kilohertz to a few megahertz. For example, the AE signal has components in a frequency range of 15 kHz to 20 kHz in the case of quartz and has components in a frequency range of 100 kHz to 1000 kHz in the case of a metal material.

A piezoelectric element, such as a lead zirconate titanate (PZT) element, is used as the AE sensor 50X. The AE sensor 50X comes into close contact with, for example, the side surface of the template Tx, with an acoustic coupler, such as an adhesive or silicon grease, and detects the AE signal.

The AE waves are mainly classified into a continuous type and a burst type. In general, for the generation of continuous AE during plastic deformation and the characteristics thereof, continuous AE is measured in order to obtain an AE count rate and an AE cumulative count. In contrast, burst AE occurs with the progress of a micro-crack in a structure and is mainly measured in order to know the position of a defect source.

The signal level of the burst AE is higher than the signal level of the continuous AE and it is necessary to accurately measure the difference between the signal arrival times of a plurality of AE sensors 50X in order to perform positioning. The number of times the burst AE occurs is small. Therefore, even though only the count rate is measured, it is important to strictly remove noise. In addition, sensors or amplifiers for detecting the continuous AE and the burst AE have a lot in common.

The AE wave is an elastic wave which is generated with the progress of a crack in a very short time or when energy associated with plastic deformation is released. Therefore, the original waveform of AE is considered to be a sharp impulse shape and includes frequency components in a wide range. The AE signals are detected by the AE sensor 50X. It is noted that the AE signal which is observed as an electrical signal does not have the original waveform, but has complicated properties due to propagation (the quality or shape of a propagation medium material) and the characteristics of the AE sensor 50X. Therefore, the AE signal indicates the output of the AE sensor 50X which has received the AE wave or an amplified electric signal. The propagation characteristics of the AE wave in AE measurement vary depending on the shape of a propagating body, attenuation, and an interface.

For example, elastic waves in a solid are classified into two types, that is, a longitudinal wave (L) and a lateral wave (S). The propagation speed of the lateral wave is about 60% of the speed of the longitudinal wave. When these waves are incident on a boundary surface, a wave which is propagated along the surface, which is called a surface wave (R), is generally generated. The speed of the surface wave is about 90% of the speed of the lateral wave.

Figure 10A:
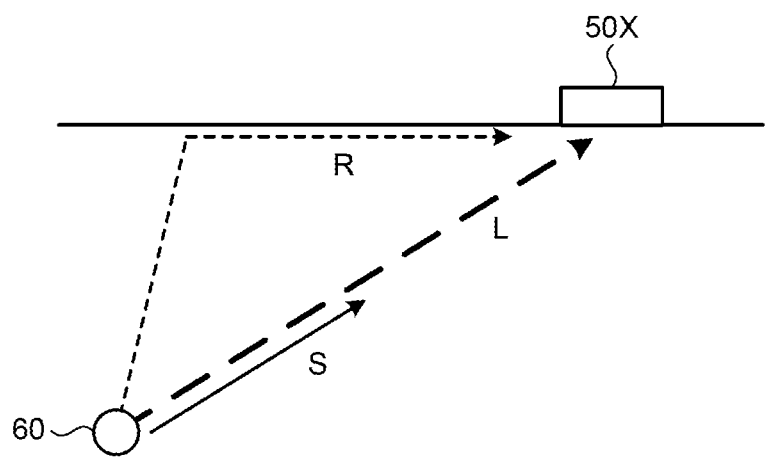
FIGS. 10A and 10B are diagrams illustrating an elastic wave.
Figure 10B:
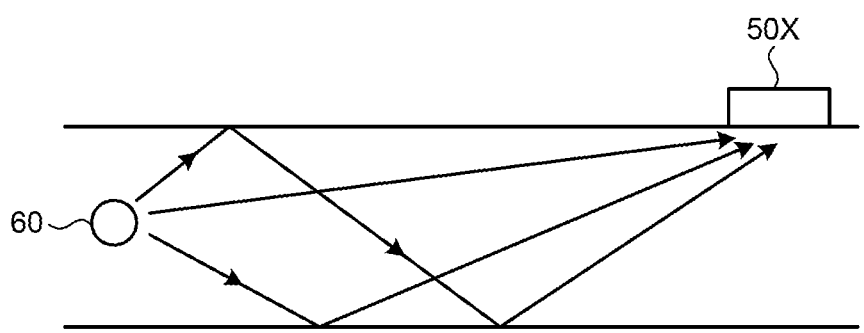

FIGS. 10A and 10B are diagrams illustrating the elastic wave. As illustrated in FIG. 10A, when AE occurs at one point (AE source 60) in a solid, the longitudinal wave L, the lateral wave S, and the surface wave R reach in tandem the AE sensor 50X which is provided on the surface of the solid and interfere with each other. As a result the aspects of the waves are complicated. This is the same as earthquake observation.

When the AE technique is actually applied, the elastic wave is less likely to be propagated through a large material to be tested, as in a semi-infinite body, but is more likely to be propagated through a large plate, such as a high-pressure container, as illustrated in FIG. 10B.

The AE wave is propagated while being repeatedly multiply-reflected from the boundary surface (the front and rear surfaces of the plate). In addition, mode conversion occurs between the lateral wave and the longitudinal wave whenever the AE wave is reflected. In this case, since the thickness of the plate is finite, there is no pure surface wave. The wave which is propagated in this way is generally referred to as a guided wave and has complicated characteristics even for a continuity of simple frequencies. In addition, an AE wave which is used to treat the transient phenomenon of the deformation or damage of an object is very complicated.

A wave in the plate is called a lamb wave or a plate wave. For a sound speed in quartz, such as the template Tx, the sound speed of the longitudinal wave is about 5000 m/s, the sound speed of the lateral wave is about 3000 m/s, the sound speed of the surface wave is about 2500 m/s. Therefore, the sound speed does not cause any problem in the measurement of, for example, an AE count rate, an AE cumulative count, and an amplitude distribution. However, when positioning is performed, the selection of the speed of a received wave is important since it is directly related to the accuracy of positioning.

In general, when the plate is thick (the plate is a steel plate and has a thickness of a few centimeters or more), an intermediate speed between the speeds of the lateral wave and the surface wave may be selected. When the plate is relatively thick, the speed may be selected with reference to the speed of the plate wave. Since the template Tx is made of quartz and has a simple structure, it is possible to simulate the elastic wave in advance.

It is noted that the rising edge and the falling edge of the AE signal are not uniform and the AE signal has some peaks when, for example, the count rate, the cumulative count, and the amplitude are measured. In addition, attenuation includes the spreading loss of the elastic wave in all directions and loss caused by friction in the solid. The former causes the attenuation of a spherical wave in a large solid and causes the attenuation of a cylindrical wave in a plate member, regardless of the frequency. The amplitude of the former is inversely proportional to the distance and the amplitude of the latter is inversely proportional to the square root of the distance. In addition, there is no spreading loss in a guided wave of a rod-shaped member.

Figure 11:
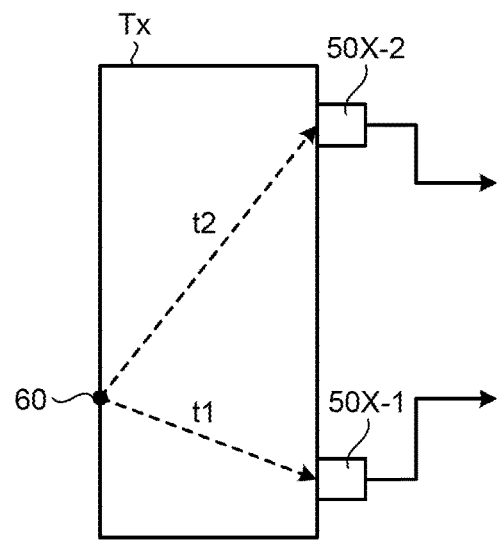
FIG. 11 is a diagram illustrating a process of detecting an AE waveform using a plurality of AE sensors.

FIG. 11 is a diagram illustrating a process of detecting an AE waveform using a plurality of AE sensors. In the imprint apparatus 101, the AE sensors 50X receive the AE signal at different times. This is because the distances between the AE source 60 and the AE sensors 50X are different from each other.

For example, as illustrated in FIG. 11, a first AE sensor 50X-1 receives the AE signal after a time t1 has elapsed from the occurrence of a defect in the AE source 60 of the template Tx. In addition, a second AE sensor 50X-2 receives the AE signal after a time t2 has elapsed from the occurrence of the defect in the AE source 60 of the template Tx.

The defect determination unit 27 specifies a defect occurrence position on the basis of, for example, the AE signals from the first AE sensor 50X-1 and the second AE sensor 50X-2 illustrated in FIG. 11. In addition, the defect determination unit 27 may specify the defect occurrence position on the basis of, for example, the AE signals from a third AE sensor 50X-3 and a fourth AE sensor 50X-4 illustrated in FIGS. 12A and 12B, which will be described below.

Figure 12A:
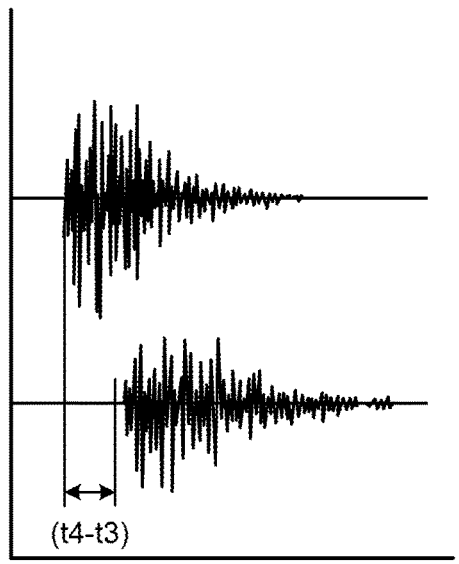
FIGS. 12A and 12B are diagrams illustrating the method for specifying the defect occurrence position.
Figure 12B:
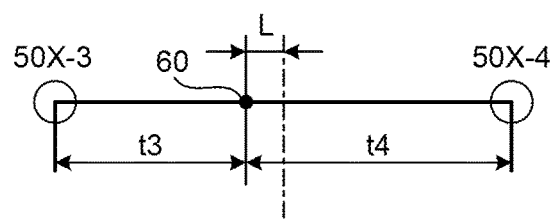

FIGS. 12A and 12B are diagrams illustrating a defect occurrence position specifying method. FIG. 12A illustrates an example of the waveform of the AE signal and FIG. 12B illustrates the positional relationship between the third AE sensor 50X-3 and the fourth AE sensor 50X-4.

It is assumed that the third AE sensor 50X-3 detects the AE signal after a time t3 has elapsed from the occurrence of the defect. In addition, it is assumed that the fourth AE sensor 50X-4 detects the AE signal after a time t4 has elapsed from the occurrence of the defect. In this case, there is a time interval (t4−t3) between the detection time of the AE signal by the third AE sensor 50X-3 and detection time of the AE signal by the fourth AE sensor 50X-4.

It is assumed that the position of the AE source 60 is shifted from the intermediate position between the third AE sensor 50X-3 and the fourth AE sensor 50X-4 to the third AE sensor 50X-3 by a distance L. In this case, when the sound speed is C, the position (distance L) of the AE source 60 can be represented by $L=(\frac{1}{2}) \times C \times (t4-t3)$. The defect determination unit 27 specifies the defect occurrence position using, for example, this expression.

When the imprint apparatus 101 includes two AE sensors 50X, the defect determination unit 27 can two-dimensionally specify the defect occurrence position. When the imprint apparatus 101 includes three AE sensors 50X, the defect determination unit 27 can three-dimensionally specify the defect occurrence position.

In a process of manufacturing a semiconductor device, the AE signal is generated due to, for example, a physical contact, breaking, and friction in a machining process. Therefore, a semiconductor device manufacturing apparatus, such as the imprint apparatus 101, may detect the AE signal as a sign of a defect or as the starting point of the occurrence of a defect. In addition, a series of defect detection functions may be applied to a defect prediction system or a defect inspection device which detects a defect in real time.

Figure 13:
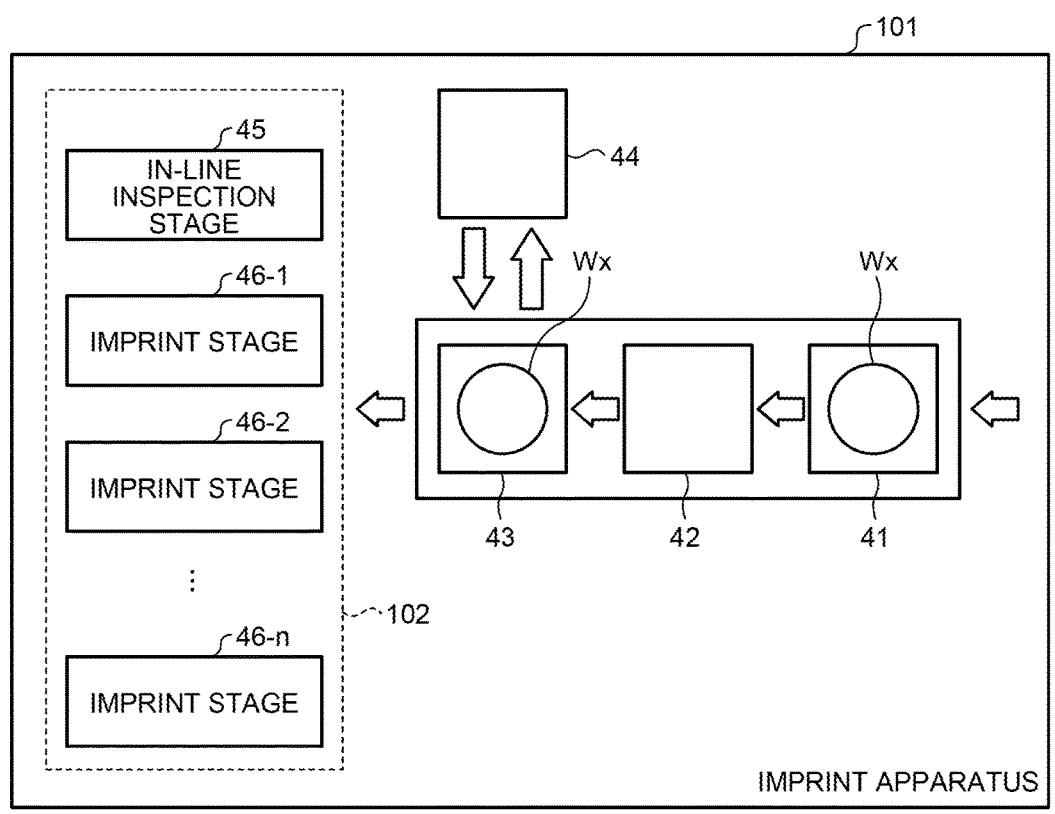
FIG. 13 is a diagram illustrating an example of the structure of an imprint apparatus including a defect inspection device.

FIG. 13 is a diagram illustrating an example of the imprint apparatus including a defect inspection device. The imprint apparatus 101 includes, for example, a wafer temperature control (WTC) stage 41, an SCH 42, a pre-alignment (PA) stage 43, a maintenance carrier 44, and a processing stage 102. The wafer Wx is transported to the processing stage 102 through the wafer temperature control stage 41, the SCH 42, the pre-alignment stage 43, and the maintenance carrier 44.

The processing stage 102 includes an in-line inspection stage 45 and imprint stages 46-1 to 46-*n* (n is a natural number). Here, the in-line inspection stage 45 and the imprint stages 46-1 to 46-*n* form the defect inspection device. Hereinafter, the imprint stages 46-1 to 46-*n* are referred to as imprint stages 46*x*.

The in-line inspection stage 45 is used to perform in-line defect inspection for the template Tx. The in-line inspection stage 45 includes an AE sensor 50X. In the in-line inspection stage 45, for example, a defect inspection process and a restoration process are performed for the template Tx.

For example, the in-line inspection stage 45 forms a template pattern with a size of a few tens of nanometers in the template Tx to restore the template Tx. Before a defect occurs in the template pattern, for example, the in-line inspection stage 45 may radiate laser light to correct a cracked portion. In addition, the in-line inspection stage 45 may compare a specified defect occurrence position with a design data (graphic data system (GDS)) and automatically perform fine correction. The process of restoring the template Tx increases the lift span of the template Tx. As described above, the imprint stage 46*x* detects, for example, a defect (a defect which has occurred or a sign of the defect) in the template Tx during the imprint process, using the AE sensor 50X.

In this embodiment, the AE sensor 50X detects the AE signal. During a certain manufacturing process (for example, during imprinting, during a process of hardening a resist pattern with UV irradiation, or during a process of separating the template Tx) in a nanoimprint process, the imprint apparatus 101 monitors the AE signal transmitted from the template Tx using the AE sensor 50X. Then, the imprint apparatus 101 measures and analyzes the behavior of the AE signal to detect the damage of the resist 40Y and the template Tx or a sign of damage (for example, breaking) in real time.

Therefore, it is possible to check a sign of a defect and to prevent the occurrence of a defect. In addition, when the resist 40Y formed on the wafer Wx is separated, it is possible to prevent, for example, a phenomenon (significant defect) in which the resist 40Y peels off from the surface of the wafer Wx, defects caused by the above-mentioned (1) to (5), and a growth defect.

That is, it is possible to monitor and analyze the AE waveform detected by the AE sensor 50X in real time and to stop the imprint apparatus 101 at the time when a defect will occur or at the time when a defect has occurred. The wafer Wx may be transferred to a reworking process and the template Tx may be transferred to, for example, a cleaning process.

As such, in this embodiment, in a patterning process, such as an imprint process, a sign of a pattern defect or the pattern defect is dynamically detected in real time and appropriate processes (for example, a process of cleaning the template Tx, a process of stopping the imprint process, a process of replacing the template Tx, a process of discarding the template Tx, and a process of reworking the wafer Wx) are performed.

For example, the imprint apparatus 101 performs the imprint process for each layer of a wafer process. Then, the imprint apparatus 101 corrects the template Tx or forms the resist 40Y again, on the basis of the AE signal detected by the AE sensor 50X.

Specifically, a film to be process is formed on the wafer Wx and the resist 40X is applied onto an upper layer of the film to be processed. Then, the imprint process is performed for the wafer Wx having the resist 40X applied thereon. In this case, the AE sensor 50X is used to detect the AE signal and it is determined whether a defect occurs on the basis of the AE signal.

When no defect occurs, the film to be processed is etched, using the resist 40Y as a mask. In this way, a pattern on the substrate corresponding to the resist 40Y is formed on the wafer Wx. When a defect occurs, the resist 40Y is removed and the imprint process is performed to form the resist 40Y again.

When a semiconductor device (semiconductor integrated circuit) is manufactured, the process of forming the film to be processed, the imprint process, the defect determination process, the pattern correction process, and the etching process are repeatedly performed for each layer.

The template Tx from which a defect is detected by the imprint apparatus 101 may be any one of a parent template, a child template, an experimental template, and a template for production. The parent template is used to transfer a template pattern to the child template.

In this embodiment, the AE sensor 50X is used to determine a defect during the imprint process. However, other types of sensors may be used to determine a defect during the imprint process. The force which is generated during the imprint process is not limited to the AE wave. For example, the force may be caused by at least one of the distortion, stress, vibration, acceleration, and angular velocity of at least one of the resists 40X and 40Y and the wafer Wx.

Therefore, sensors which measure, for example, AE, distortion, bending, stress, vibration, acceleration, gyro (angular velocity) and seismometer may be used as the piezoelectric element sensor which determines a defect during the imprint process. The defect determination unit 27 determines a defect during the imprint process on the basis of the force generated from at least one of the template Tx, the resists 40X and 40Y, and the wafer Wx.

As such, in the first embodiment, a defect during the imprint process is determined on the basis of the force (for example, the AE wave) generated from at least one of the template Tx, the resists 40X and 40Y, and the wafer Wx during the imprint process. Therefore, it is possible to easily detect a defect during the imprint process in a short time.

Since a defect is determined on the basis of, for example, the AE wave, it is possible to reduce the number of inspection processes required to manage defects. In addition, it is possible to prevent time loss until a defect is detected and to prevent a defective product from being manufactured (production loss).

Second Embodiment

Next, a second embodiment will be described with reference to FIGS. 14A and 14B. In the second embodiment, an AE sensor is directly provided on a template. A defect during an imprint process is determined on the basis of an AE signal from the AE sensor provided on the template.

Figure 14A:
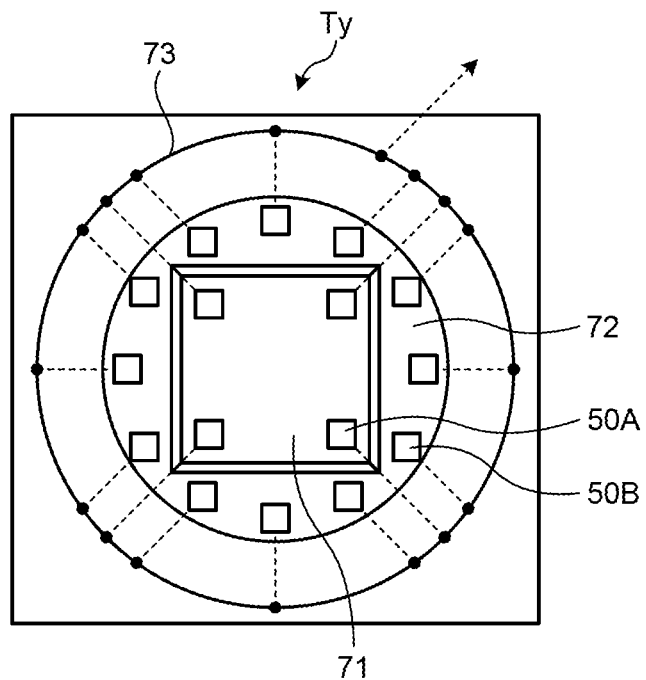
FIGS. 14A and 14B are diagrams illustrating an example of the structure of a template having AE sensors provided thereon.
Figure 14B:
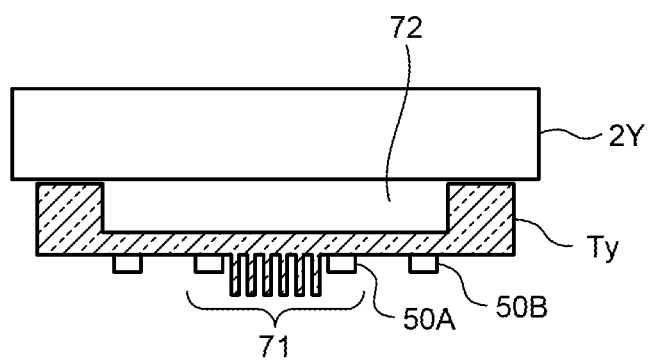

FIGS. 14A and 14B are diagrams illustrating an example of the structure of the template having the AE sensor provided thereon. FIG. 14A is a top view illustrating a template Ty and FIG. 14B is a cross-sectional view illustrating the template Ty and an original plate stage 2Y. Among the components illustrated in FIGS. 14A and 14B, components for achieving the same function as that of the template Tx according to the first embodiment illustrated in FIG. 3 are denoted by the same reference numerals and the description thereof will not be repeated.

The template Ty has the same substrate structure as the template Tx. A pattern region 71 is provided in a central region of the surface of the template Ty. The template Ty is fixed by the original plate stage 2Y from the rear surface side. A counter bore 72 is provided in the pattern region 71 and a region which is arranged outside the pattern region 71.

AE sensors 50A and AE sensors 50B are provided on the surface of the template Ty. Specifically, one or a plurality of AE sensors 50A are provided in the pattern region 71. In addition, one or a plurality of AE sensors 50B are provided in the region which is arranged outside the pattern region 71.

The AE sensors 50A and 50B are connected to a signal extraction wire group 73 and the signal extraction wire group 73 is connected to a control device 20. This structure makes it possible to detect, for example, a defect during an imprint process, using the AE sensors 50A and the AE sensors 50B.

As such, in the second embodiment, the AE sensors 50A and 50B are provided on the template Ty. Therefore, it is possible to accurately detect the force (for example, an AE wave) which is generated during the imprint process. As a result, it is possible to easily detect a defect during the imprint process in a short time.

Third Embodiment

Next, a third embodiment will be described with reference to FIGS. 15A and 15B. In the third embodiment, an AE sensor is provided on a side electrostatic chuck which corrects the distortion of a template from the side surface. In the third embodiment, the AE sensor may be provided on an upper electrostatic chuck which corrects the distortion of a template from an upper surface.

Figure 15A:
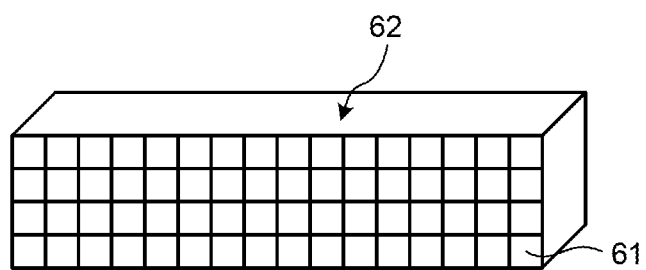
FIGS. 15A and 15B are diagrams illustrating an example of the structure of a side electrostatic chuck having AE sensors provided therein.
Figure 15B:
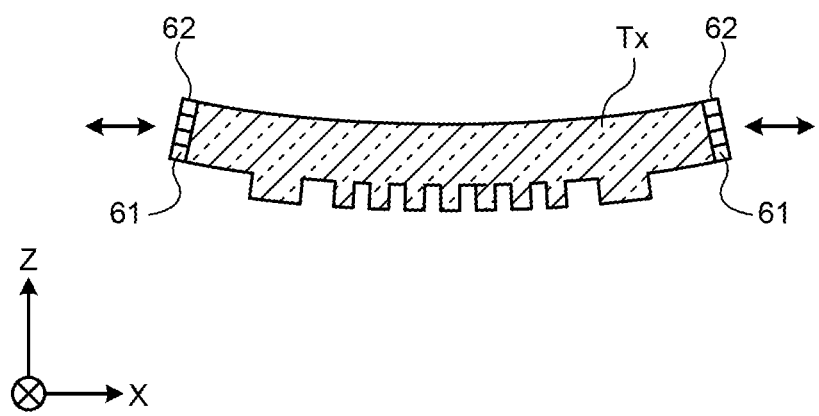

FIGS. 15A and 15B are diagrams illustrating an example of the structure of the side electrostatic chuck having the AE sensor provided thereon. FIG. 15A is a perspective view illustrating a side electrostatic chuck 62 and FIG. 15B is a cross-sectional view illustrating the side electrostatic chuck 62 and a template Tx.

The template Tx is fixed by an actuator 31X, the side electrostatic chuck 62, and an upper electrostatic chuck 64, which will be described below, and is then pressed against resist 40X. The side electrostatic chuck 62 is a template chuck which fixes the side surface of the template Tx from the outer circumferential side of the template Tx. An imprint apparatus 101 includes four side electrostatic chucks 62 which fix four side surfaces of the template Tx.

The side electrostatic chuck 62 is an electrostatic chuck for correcting a magnification ratio (MAG). The side electrostatic chuck 62 may perform chuck force control using a piezoelectric sensor to adjust the MAG. The side electrostatic chuck 62 corrects the distortion of the template Tx in the X-Y plane.

The side electrostatic chuck 62 includes a plurality of chuck portions 61 which are arranged in a lattice shape. In the side electrostatic chuck 62, a voltage on the upper side (the positive side in the Z-axis direction) of each chuck portion 61 and a voltage on the lower side (the negative side in the Z-axis direction) of each chuck portion 61 are adjusted. In this way, an electrostatic chuck force is applied to the side surface of the template Tx. The electrostatic chuck force applied to the template Tx is adjusted to various levels, depending on the position of each chuck portion 61. As a result, for example, the bending, distortion, and warpage of the template Tx are corrected.

In this embodiment, an AE sensor, such as an AE sensor 50X, is attached to each chuck portion 61. Therefore, it is possible to finely adjust, for example, the bending of the template Tx and to accurately detect an AE signal from the template Tx.

Figure 16A:
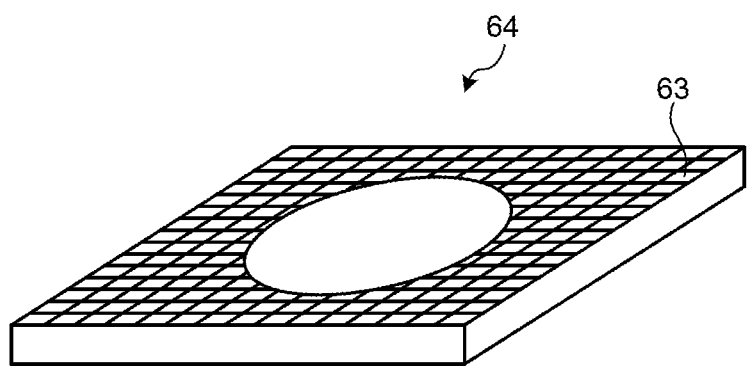
FIGS. 16A and 16B are diagrams illustrating an example of the structure of an upper electrostatic chuck having AE sensors provided therein.
Figure 16B:
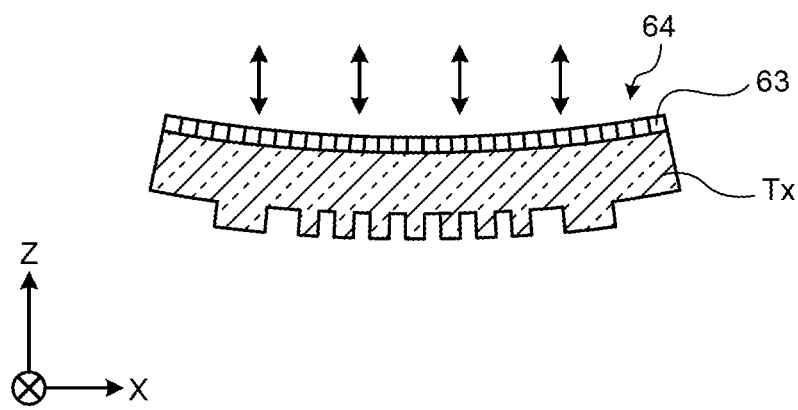

FIGS. 16A and 16B are diagrams illustrating an example of the structure of an upper electrostatic chuck having AE sensors provided thereon. FIG. 16A is a perspective view illustrating the upper electrostatic chuck 64 and FIG. 16B is a cross-sectional view illustrating the upper electrostatic chuck 64 and the template Tx.

The upper electrostatic chuck 64 is a template chuck which fixes the upper surface (rear surface) of the template Tx from the upper side of the template Tx. The upper electrostatic chuck 64 corrects a template surface (for example, the warpage of the surface in the Z-axis direction). The upper electrostatic chuck 64 may perform chuck force control using a piezoelectric sensor to correct, for example, the distortion of the template surface.

The upper electrostatic chuck 64 includes a plurality of chuck portions 63 which are arranged in a lattice shape. In the upper electrostatic chuck 64, a voltage applied to each chuck portion 63 is adjusted. In this way, an electrostatic chuck force is applied to the upper surface of the template Tx. The electrostatic chuck force applied to the template Tx is adjusted to various levels, depending on the position of each chuck portion 63. As a result, for example, the bending, distortion, and warpage of the template Tx in the Z-axis direction are corrected.

In this embodiment, an AE sensor, such as an AE sensor 50X, is attached to each chuck portion 63. Therefore, it is possible to finely adjust, for example, the bending of the template Tx and to accurately detect an AE signal from the template Tx.

As such, in the third embodiment, the AE sensors 50X are provided in the chuck portions 61 or 63 of the side electrostatic chuck 62 or the upper electrostatic chuck 64. Therefore, it is possible to accurately detect the force (for example, an AE wave) which is generated during the imprint process. As a result, it is possible to easily detect a defect during the imprint process in a short time.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An imprint apparatus comprising:
   a contact processing unit that brings a template pattern formed on a front surface of a template into contact with resist placed on a substrate;
   a defect determination unit that determines a defect in an imprint process, on the basis of an acoustic emission wave generated during the imprint process from at least one of the template, the resist, and the substrate, the acoustic emission wave being a wave that is detected at a side surface of the template;
   a first detection unit that detects the acoustic emission wave; and
   a holding unit that holds the template by pressing the template from the side surface,
   wherein
   the first detection unit is provided in the holding unit, and
   the holding unit is an actuator that presses the side surface of the template and includes a d33-mode piezoelectric element, a d31-mode piezoelectric element, and the first detection unit that are connected in series.

2. The imprint apparatus according to claim 1, wherein the defect determination unit compares at least one of the frequency, amplitude, waveform, generation time, and generation interval of the acoustic emission wave with at least one predetermined threshold value to determine the defect in the imprint process.

3. The imprint apparatus according to claim 1, wherein, when the defect determination unit detects the defect during the imprint process, the imprint process is stopped.

4. The imprint apparatus according to claim 1, wherein the defect determination unit determines the defect in the imprint process during at least one of an imprint process of bringing the resist into contact with the template pattern, a hardening process of hardening the resist, and a separation process of separating the hardened resist from the template pattern.

5. The imprint apparatus according to claim 1, further comprising:
   a first detection unit that detects an acoustic emission wave in a first frequency range; and
   a second detection unit that detects an acoustic emission wave in a second frequency range.

6. The imprint apparatus according to claim 1, wherein the acoustic emission wave is caused by at least one of distortion, stress, vibration, acceleration, and angular velocity of at least one of the template, the resist, and the substrate.

* * * * *